(12) United States Patent
Miyata

(10) Patent No.: US 8,878,307 B2
(45) Date of Patent: Nov. 4, 2014

(54) SHARED CONTACTS FOR MOSFET DEVICES

(75) Inventor: Koji Miyata, Mahopac, NY (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 1618 days.

(21) Appl. No.: 11/064,586

(22) Filed: Feb. 24, 2005

(65) Prior Publication Data

US 2006/0186482 A1    Aug. 24, 2006

(51) Int. Cl.
| | |
|---|---|
| *H01L 29/76* | (2006.01) |
| *H01L 29/66* | (2006.01) |
| *H01L 21/8234* | (2006.01) |
| *H01L 21/768* | (2006.01) |
| *H01L 21/8238* | (2006.01) |
| *H01L 29/78* | (2006.01) |

(52) U.S. Cl.
CPC .. *H01L 29/66636* (2013.01); *H01L 21/823475* (2013.01); *H01L 21/76895* (2013.01); *H01L 29/78* (2013.01); *H01L 21/823871* (2013.01); *Y10S 257/903* (2013.01)
USPC .......................................... 257/393; 257/903

(58) Field of Classification Search
USPC ............................. 257/393, 903–904, E27.098
See application file for complete search history.

(56) References Cited

U.S. PATENT DOCUMENTS

| | | | | |
|---|---|---|---|---|
| 5,621,232 | A * | 4/1997 | Ohno ............................. | 257/903 |
| 5,821,136 | A | 10/1998 | Chan et al. ..................... | 438/158 |
| 6,169,313 | B1 | 1/2001 | Tsutsumi et al. ............. | 257/390 |
| 6,492,244 | B1 * | 12/2002 | Christensen et al. ......... | 438/404 |
| 6,794,730 | B2 * | 9/2004 | Kim et al. ...................... | 257/565 |
| 7,176,522 | B2 * | 2/2007 | Cheng et al. .................. | 257/338 |
| 2001/0001322 | A1 | 5/2001 | Kim .................................. | 709/1 |
| 2002/0093042 | A1 * | 7/2002 | Oh et al. ........................ | 257/303 |
| 2002/0195686 | A1 | 12/2002 | Kim et al. ...................... | 257/621 |
| 2004/0051143 | A1 | 3/2004 | Oh et al. ........................ | 257/347 |
| 2004/0178516 | A1 | 9/2004 | Ogata ............................ | 257/903 |
| 2004/0207017 | A1 | 10/2004 | Matsumoto et al. .......... | 257/347 |

OTHER PUBLICATIONS

Ghani, T. et al., "A 90nm High Volume Manufacturing Logic Technology Featuring Novel 45nm Gate Length Strained Silicon CMOS Transistors," Portland Technology Development, Intel Corporation, Hillsboro, Oregon, date unknown, but prior to the filing date of the instant application, 3 pages.

"Shrinking Six-Transistor SRAM Cell Size Leads to Larger Embedded Memory," http://www.elecdesign.com/Globals/PlanetEE/Content/1106.html, Nov. 17, 1997, pp. 1-5.

* cited by examiner

*Primary Examiner* — Cuong Q Nguyen
(74) *Attorney, Agent, or Firm* — Karin L. Williams; Mayer & Williams PC

(57) ABSTRACT

In one aspect, the present invention provides electronic devices that comprise a doped semiconductor shared contact between (a) a gate conductor region of at least one transistor and (b) a source/drain diffusion region of at least one transistor. One specific example of such as shared contact, among many others, is a doped SiGe shared contact between (a) a gate conductor region shared by an N-channel MOSFET and a P-channel MOSFET and (b) a drain diffusion region of an N-channel MOSFET or of a P-channel MOSFET.

15 Claims, 5 Drawing Sheets

US 8,878,307 B2

SHARED CONTACTS FOR MOSFET DEVICES

FIELD OF THE INVENTION

The present invention relates to shared contacts that are provided between a gate of one MOSFET transistor and a source or drain region of another MOSFET transistor, for example, within SRAM devices.

BACKGROUND OF THE INVENTION

MOSFET devices are widely used in electronic products. One common example of a MOSFET device is a static random access memory (SRAM) device, which holds binary information. SRAMs are frequently used in the electronics industry, due to their combination of speed, low power, and lack of requirement for refresh.

Standard SRAM cells commonly use cross-coupled inverters, having two N-channel and two P-channel transistors each, accessed by two pass transistors. Such cells are sometimes referred to as "6T" cells, since (with the two pass transistors) they have six transistors per cell, although other configurations are possible (e.g., four pass transistors are used to access the SRAM cell in 2-port memory devices, etc.).

An equivalent circuit for a conventional SRAM circuit is shown in FIG. 1A. As shown in FIG. 1A, the SRAM includes first and second inverters INV1 and INV2, which form a latch, and access transistors TA1 and TA2 for selectively driving the first and second inverters INV1 and INV2. The first inverter INV1 includes a first PMOS transistor TP1 and a first NMOS transistor TN1, and the second inverter INV2 includes a second PMOS transistor TP2 and a second NMOS transistor TN2. The source of each of the first and second PMOS transistors TP1 and TP2 is coupled to a voltage terminal Vdd. The drain of the first PMOS transistor TP1 is coupled to the drain of the first NMOS transistor TN1, while the drain of the second PMOS transistor TP2 is coupled to the drain of the second NMOS transistor TN2. The source of each of the first and second NMOS transistors TN1 and TN2 is coupled to a ground voltage terminal Vss. The gate of the first PMOS transistor TP1 is coupled to that of the first NMOS transistor TN1, and the two gates are coupled to the output terminal S2 of the second inverter INV2, that is, to a common drain between the second PMOS transistor TP2 and the second NMOS transistor TN2. The gate of the second PMOS transistor TP2 is coupled to that of the second NMOS transistor TN2, and the two gates are coupled to the output terminal S1 of the first inverter INV1, that is, to a common drain between the first PMOS transistor TP1 and the first NMOS transistor TN1. The gate of the first access transistor TA1 is coupled to a word line WL, its source is coupled to a bit line BL, and its drain is coupled to the output terminal S1 of the first inverter INV1. Similarly, the gate of the second access transistor TA2 is coupled to the word line WL, its source is coupled to a bit line bar DBL, and its drain is coupled to the output terminal S2 of the second inverter INV2. Here, the bit line bar DBL line carries the inverted BL signal.

In circuits that utilize MOSFET devices, including SRAMs, a gate electrode of one transistor may be directly connected with a neighboring source or drain region of another transistor. If the gate electrode and the source/drain region are closely arranged, a shared contact may be formed for electrical connection, instead of separate contacts. Shared contacts are advantageous, for example, in that a reduction in cell size is generally achieved as the number of contacts decreases.

For example, FIG. 1B illustrates one (of many) possible layouts of an SRAM cell having an equivalent circuit like that of FIG. 1A. FIG. 1B shows access transistors TA1 and TA2, a first inverter including a first PMOS transistor TP1 and a first NMOS transistor TN1, and a second inverter including a second PMOS transistor TP2 and a second NMOS transistor TN2, including various gate regions G1, G2 and drain/source regions D1, D2, D3, D4 corresponding to these transistors. Shared contacts S are also illustrated. FIG. 1B further shows a voltage terminal Vd, ground voltage terminal Vs, word line W, bit line B, and bit line bar DB.

A specific conventional example of a shared contact region of an SRAM cell is shown in schematic cross-section in FIG. 2A. This figure illustrates a semiconductor substrate such as a silicon substrate 10, which contains a P well 12$p$, an N well 12$n$, and intervening isolation regions 20. Over the N well 12$n$ is positioned a gate region 34$b$, which contains a gate conductor and gate insulator (not separately illustrated) and which corresponds, for example, to the gate of transistor TP2 in FIGS. 1A-1B. On either side of the gate region 34$b$ are P-type diffusion regions, 14$ps$ and 14$pd$, which correspond, for example, to the source and drain regions of transistor TP2 in FIGS. 1A-1B. Over the P well is positioned gate region 34$a$, which contains a gate conductor and gate insulator and which corresponds, for example, to a shared gate region of transistors TP1 and TN1 in FIGS. 1A-1B. The gate region 34$a$ is connected via shared contact 32$s$ to N-type region 14$n$, which corresponds, for example, to the drain of transistor TN2 in FIGS. 1A-1B. Shared contact 32$s$, and well as other contacts 32$a$, 32$b$, 32$c$ are provided within insulating layer 30. Contacts 32$s$, 32$a$, 32$b$, 32$c$, may be created, for example, by forming holes in the dielectric layer 30, and subsequently filling the holes with a metal, such as tungsten. Metal interconnects, such as 42$a$ and 42$b$ are then provided.

The conventional structure shown in FIG. 2A has at least two significant disadvantages. First, as the device shrinks, it becomes more and more difficult to establish shared contacts 32$s$ which reach both the gate 34$a$ and the diffusion region 14$n$, without experiencing problems in conjunction with alignment, etch stops and metal filling, each of which may adversely affects yield. A second problem is that the metal interconnect region 42$a$ cannot make contact with the shared contact 32$s$, but rather must be isolated from it by routing the metal interconnect region 42$a$ around the shared contact 32$s$. This adversely affects area use efficiency.

An alternative approach is shown in FIG. 2B. This approach, like the one of FIG. 2A, has similar problems with respect to alignment, etch stops and metal filling during formation of the shared contact 32$s$. The second issue of avoiding contact between the metal interconnect region 42$a$ and shared contact 32$s$, however, is addressed by providing a dielectric layer between them. However, this process requires separate steps for the formation of the shared contact 32$s$ and the other contacts 32$a$, 32$b$, 32$c$, thereby increasing processing costs.

SUMMARY OF THE INVENTION

The above and other drawbacks of devices having shared contacts are addressed by the present invention, in which electronic devices are provided that comprise a doped semiconductor shared contact between a gate conductor region of at least one transistor and a diffusion region of at least one transistor.

One specific example of such a shared contact, among many others, is a doped SiGe shared contact between (a) a gate conductor region shared by an N-channel MOSFET and a P-channel MOSFET and (b) a drain diffusion region of an N-channel MOSFET or of a P-channel MOSFET. Numerous other examples are discussed in the Detailed Description below.

An advantage of the present invention is that problems associated with alignment, etch stops and metal filling that are experienced with other shared contact designs are avoided.

These and other aspects, embodiments and advantages of the present invention will become immediately apparent to those of ordinary skill in the art upon review of the Detailed Description and claims to follow.

DETAILED DESCRIPTION

A more complete understanding of the present invention is available by reference to the following detailed description of various aspects and embodiments of the invention. The detailed description of the invention which follows is intended to illustrate but not limit the invention. The scope of the invention is defined by the claims.

In general, electronic devices benefiting from the present invention are MOSFET devices for which it is desired to provide a shared contact between a gate conductor region of at least one transistor and a diffusion region of at least one other transistor (e.g., between a gate conductor region positioned over a semiconductor substrate and a diffusion region within the substrate, such as a source or drain diffusion region). In the present invention, the shared contact is a doped semiconductor shared contact.

Figure 3:
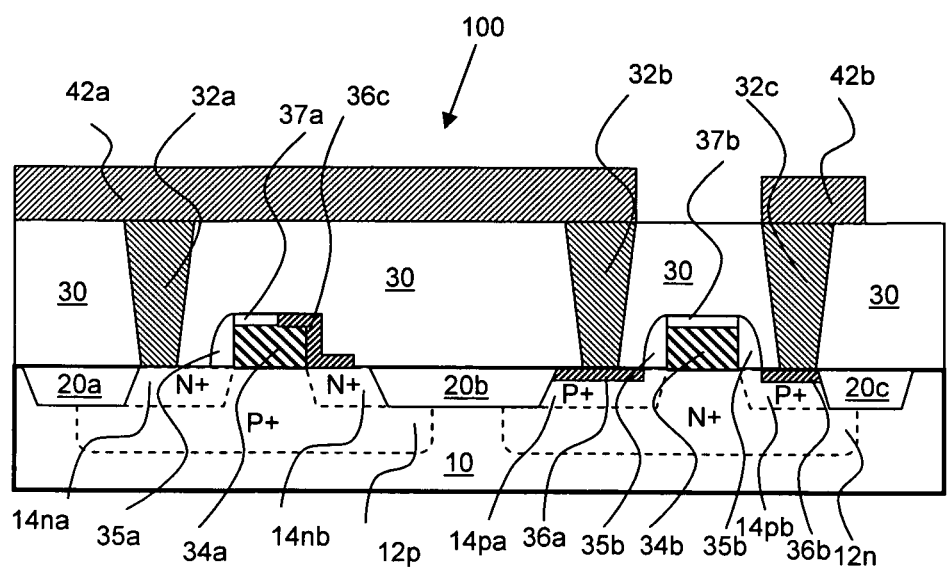
FIG. 3 illustrates a schematic cross-section of a shared contact region, in accordance with an embodiment of the present invention.

FIG. 3 is an illustration of an SRAM cell 100 in accordance with an embodiment of the invention. It should be noted at the outset that, although the discussion to follow describes the use of SiGe shared contacts for connecting diffusion regions of N-channel double-diffused MOSFETs (DMOS transistors) to gate conductor regions within SRAM devices, including SRAM devices having embedded SiGe regions, the invention is not so limited. For example, the invention is directed to the following: (a) shared contact materials in addition to doped SiGe contacts (including other doped semiconductor contacts such as doped Si contacts, doped Ge contacts, doped III-V semiconductor contacts, doped II-VI semiconductor contacts, and so forth), (b) contact with diffusion regions in addition to N-type diffusion regions, (c) MOSFETs in addition to double-diffused MOSFETs (e.g., single diffused MOSFETs, silicon-on-insulator MOSFETs, etc.), (d) devices in addition to SRAM devices (e.g., bipolar devices, etc.), (e) devices in addition to those containing embedded SiGe regions, and (f) circuits in addition to digital circuits (e.g., analog circuits).

In the partial cross-sectional view of FIG. 3, an SRAM cell 100 is illustrated, which is built upon a substrate 10, such as a silicon substrate. Within an upper surface of the substrate 10 are formed dielectric isolation regions 20, such as field oxide regions, which typically extend to a maximum depth ranging from 100 nm to 500 nm.

Between the isolation regions 20a and 20b is provided a P well 12p, which is typically doped with a P-type dopant such as boron, among others, to a doping concentration ranging from $1\times10^{15}$ to $1\times10^{17}$ cm$^{-3}$ and to a maximum depth ranging from 50 nm to 200 nm. Between the isolation regions 20b and 20c is provided an N well 12p, which is typically doped with a N-type dopant such as arsenic or phosphorous, among others, to a doping concentration ranging from $1\times10^{15}$ to $1\times10^{17}$ cm$^{-3}$ and to a maximum depth ranging from 50 nm to 200 nm.

Proximate the surface of the P well 12p are N-type diffusion regions 14na and 14nb, which typically have a maximum doping concentration ranging from $1\times10^{13}$ to $1\times10^{15}$ cm$^{-3}$ and a maximum depth ranging from 400 nm to 800 nm. Proximate the surface of the N well 12n are P-type diffusion regions 14pa and 14pb, which typically have a maximum doping concentration ranging from $1\times10^{13}$ to $1\times10^{15}$ cm$^{-3}$ and a maximum depth ranging from 400 nm to 800 nm.

Over the P and N wells 12p, 12n are provided gate regions 34a and 34b, each of which includes a gate conductor (e.g., doped polysilicon having a conductivity ranging from 0.01 ohm-cm to 1 ohm-cm) separated from the substrate 10 by a gate dielectric (e.g., silicon oxide having a thickness ranging from 8 to 20 Angstroms). The gate regions 34a, 34b are flanked by dielectric spacers, formed from a material such as silicon oxide or silicon nitride, among others.

A doped semiconductor shared contact such as a doped SiGe shared contact 36 is provided over, and in electrical contact with, a portion of gate region 34a and a portion of N-type diffusion 14n. It is note that in the present example, the left and right diffusion regions 14na and 14nb are connected, however, in other applications, the diffusion regions are separate. In the embodiment illustrated, embedded SiGe regions 36a, 36b are also provided at the surface of the P-type diffusion regions 14pa and 14pb. The doped SiGe regions are typically about 25 nm to 100 nm in thickness and having a maximum doping concentration ranging from $1\times1^{15}$ to $1\times1^{17}$ cm$^{-3}$. Typical dopants are N-type dopants such as phosphorus. The molar ratio of silicon to germanium in the alloy typically ranges from 2:1 to 1:2.

Contacts 32a, 32b, 32c, typically metallic contacts such as tungsten, are provided within a dielectric layer 30 such as silicon dioxide or silicon nitride. Over the dielectric layer 30 are disposed conductive interconnects 42a, 42b, typically metallic interconnects such as tungsten. Interconnect 42a is in electrical contact with contacts 32a, 32b, whereas interconnect 42 is in electrical contact with contact 32c.

Figure 1A:
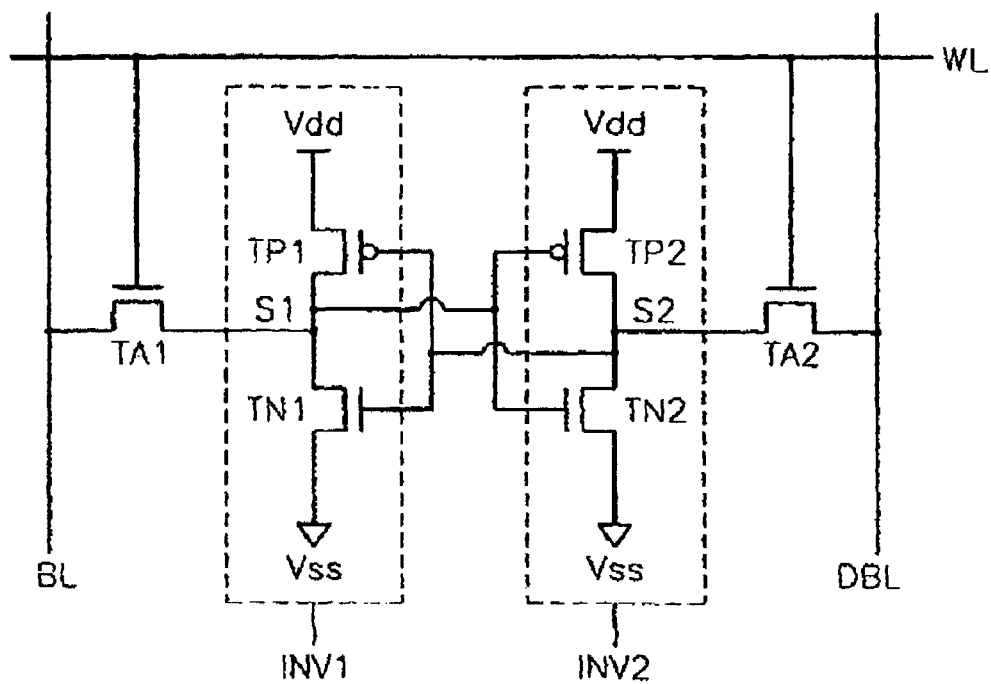
FIG. 1A illustrates an equivalent circuit for a conventional SRAM circuit.
Figure 1B:
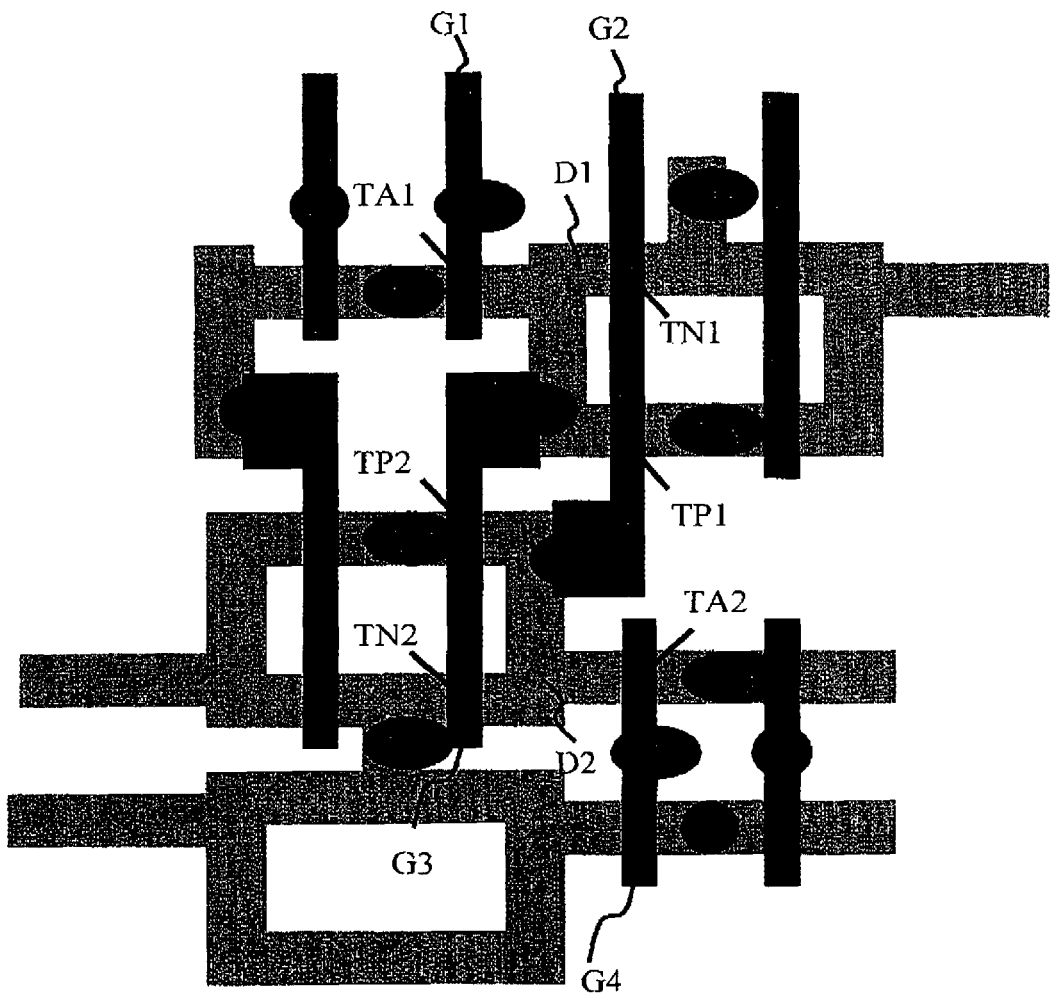
FIG. 1B is a layout of an SRAM cell illustrating, among other things, shared contacts associated with the SRAM cell.
Figure 2A:
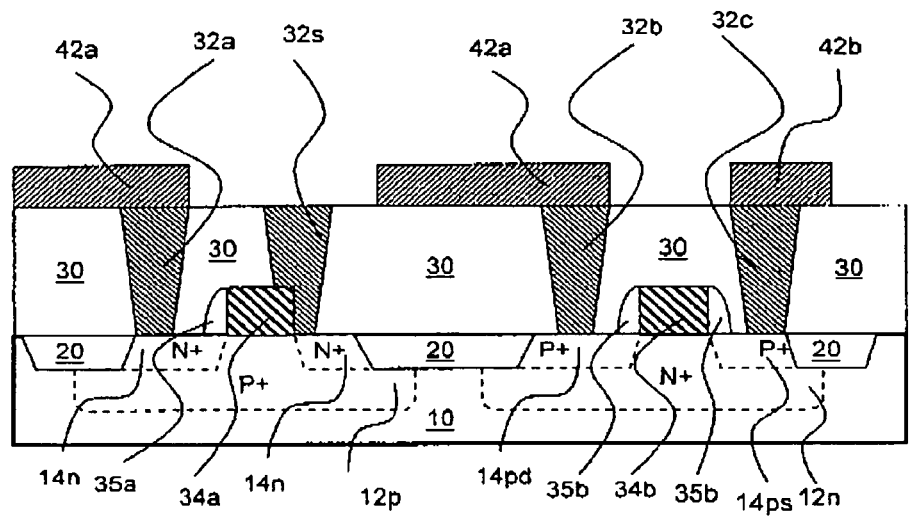
FIG. 2A illustrates a schematic cross-section of a conventional example of a shared contact region of an SRAM cell.
Figure 2B:
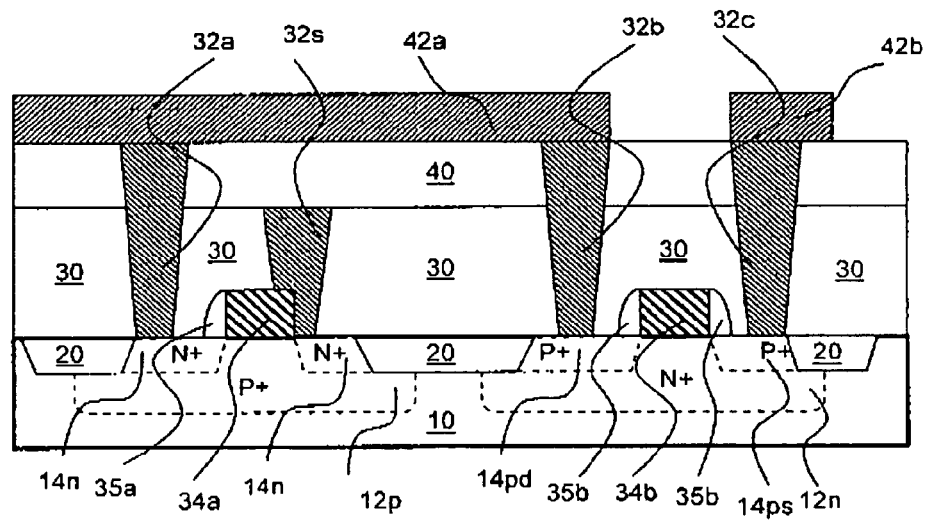
FIG. 2B illustrates a schematic cross-section of another conventional example of a shared contact region of an SRAM cell.

In the particular embodiment shown in FIG. 3, gate region 34a may correspond, for example to a shared gate of transistors TP1 And TN1 in FIG. 1, while N-type diffusion region 14nb may correspond to the drain region of transistor TN2, while the gate region 34a and P-type diffusion regions 14pa, 14pb may correspond to the gate, drain and source regions of transistor TP2.

One of ordinary skill in the art will recognize, however, that innumerable other schemes are possible.

An exemplary scheme for making the device FIG. 3 will now be discussed in conjunction with FIGS. 4A-4D.

A semiconductor substrate 10, for example, a silicon substrate, is provided, whereupon dielectric isolation regions 20 are formed in the substrate using a process such as an STI (shallow trench isolation) or a LOCOS (local oxidation of silicon) process. N and P wells 12p, 12n are then formed, followed, if desired, by VT adjust implants. A gate oxide layer (not separately illustrated), a doped polysilicon layer and a dielectric layer (e.g., SiN) are then formed over the substrate 10 and patterned, creating the gate structures 34a, 34b for the device which have dielectric caps 37a, 37b. Tip/halo implants may also be performed, if desired, followed by deposition of a spacer dielectric layer 35, such as silicon oxide or silicon nitride. After masking the P well (N channel) regions of the device, spacers 35b are etched in the N well (P channel regions), for example, by performing a dry etching step. This is followed the formation of recesses 12r in the N well 12n, for example, using a dry etching step. The mask is then removed from the P-well regions, resulting in the structure shown in FIG. 4A.

Figure 4A:
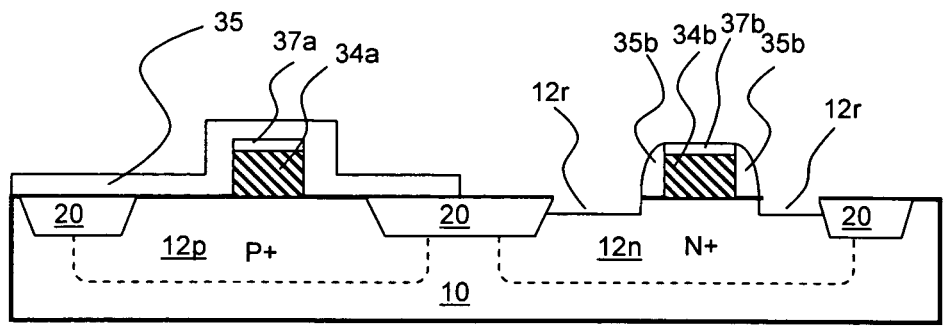
FIGS. 4A-4D are schematic cross-sections illustrating a method of forming the shared contact region of FIG. 3, in accordance with an embodiment of the present invention.
Figure 4B:
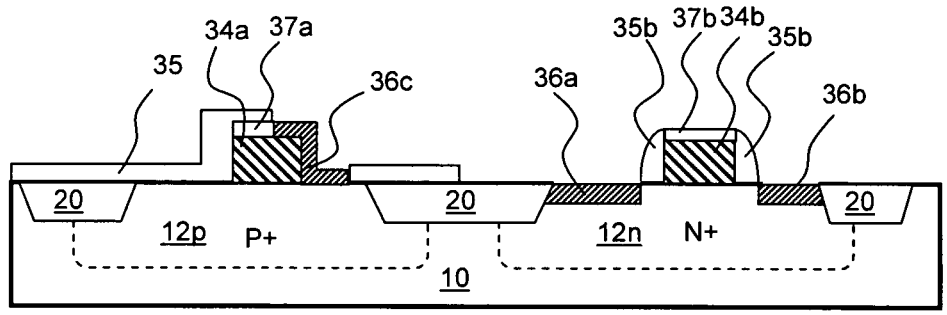

A further mask is then provided, and a hole is then patterned in the dielectric layers 35, 37a through an aperture in the further mask, for example, via an additional etch step. The further mask is removed, and an SiGe epitaxial layer is then grown over the device surface, for example, by a silicon epitaxial growth process, thereby forming SiGe shared contact 36c, and well as recessed SiGe regions 36a and 36b. The resulting structure is shown in FIG. 4B.

The spacer dielectric layer 35 is then etched in the P well region (with or without a mask over the N well region), thereby forming spacer 35a on left side of the gate 34a. N impurity ions are then implanted/diffused in the P well region, forming diffusion regions 14na and 14nb. Similarly, P impurity ions are implanted/diffused in the N well region, forming diffusion regions 14pa and 14pb. The resulting structure is illustrated in FIG. 4C.

Figure 4C:
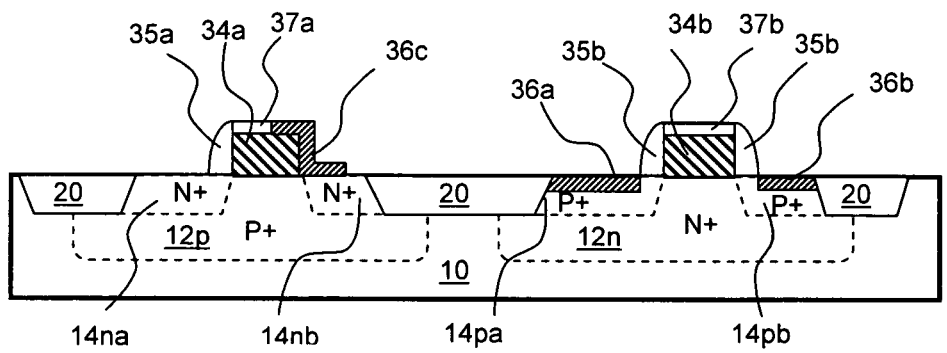
Figure 4D:
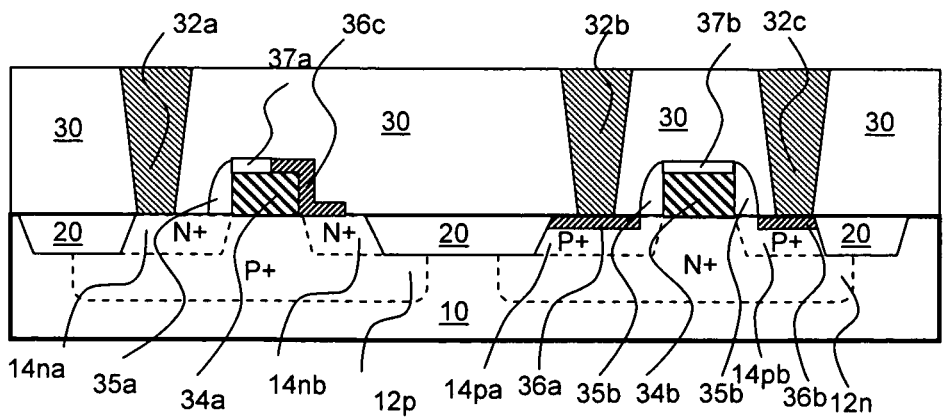

A dielectric layer 30, such as a layer of silicon dioxide, is then deposited over the structure of FIG. 4C, which is then masked and etched to form contact holes as is known in the SRAM art. A conductive layer such as a tungsten layer is then deposited, filling the contact holes, and the conductive layer is etched or polished to the upper surface of 30 to produce contacts 32a, 32b, 32c as illustrated in FIG. 4D.

An additional conductive layer is then deposited, masked and etched to form interconnects 42a, 42b, as illustrated in FIG. 3. Additional processes are then conducted as is known in the art.

Although various embodiments are specifically illustrated and described herein, it will be appreciated that modifications and variations of the present invention are covered by the above teachings and are within the purview of the appended claims without departing from the spirit and intended scope of the invention.

The invention claimed is:

1. An electronic device comprising a doped semiconductor shared contact between (a) a gate conductor region of at least one transistor and (b) a diffusion region of at least one transistor, wherein a single dielectric layer extends from a top surface of said gate conductor region to a conductive interconnect, said conductive interconnect disposed directly over and adjacent to the single dielectric layer, and further wherein said shared contact does not extend to a top surface of said single dielectric layer,
wherein the electronic device comprises an SRAM cell, and
further wherein said device comprises (a) a first shared contact between (i) a gate conductor region shared by a first N-channel MOSFET and a first P-channel MOSFET and (ii) a drain diffusion region of a second N-channel MOSFET, (b) a second shared contact between (i) a gate conductor region shared by said second N-channel MOSFET and a second P-channel MOSFET and (ii) a drain diffusion region of said first P-channel MOSFET.

2. The device of claim 1, wherein said gate conductor region is shared by at least two transistors.

3. The device of claim 1, wherein said diffusion region is shared by at least two transistors.

4. The device of claim 1, wherein at least one of said transistors is a double diffused MOSFET.

5. The device of claim 1, comprising a bipolar transistor device.

6. The device of claim 1, wherein the doped semiconductor shared contact comprises a doped semiconductor alloy.

7. The device of claim 6, wherein said doped semiconductor alloy comprises silicon and germanium.

8. The device of claim 7, wherein the molar ratio of silicon to germanium in the alloy ranges from 2:1 to 1:2.

9. The device of claim 7, wherein said doped semiconductor alloy is doped with an N-type dopant.

10. The device of claim 7, wherein said gate conductor region and said source/drain diffusion region each comprises silicon.

11. The device of claim 7, wherein said device comprises a MOSFET having a doped semiconductor alloy in its source region, drain region or both.

12. The device of claim 7, wherein said device comprises a MOSFET having a doped semiconductor alloy comprising silicon and germanium embedded in its source region, drain region or both.

13. An electronic device comprising a substrate, a doped region of first conductivity type within said substrate, a diffusion region of second conductivity type opposite said first conductivity type within said doped region, a gate region comprising a gate conductor and a gate oxide over said doped region, and a doped semiconductor shared contact between said gate conductor and said diffusion region,
wherein a single dielectric layer extends from a top surface of said gate region to a conductive interconnect at a top surface of said single dielectric layer, said conductive interconnect disposed directly over and adjacent to the single dielectric layer, and
further wherein said shared contact does not extend to the top surface of said single dielectric layer,
wherein the electronic device comprises an SRAM cell, and
further wherein said device comprises (a) a first shared contact between (i) a gate conductor region shared by a first N-channel MOSFET and a first P-channel MOSFET and (ii) a drain diffusion region of a second N-channel MOSFET, (b) a second shared contact between (i) a gate conductor region shared by said second N-channel MOSFET and a second P-channel MOSFET and (ii) a drain diffusion region of said first P-channel MOSFET.

14. The device of claim 13, wherein said first conductivity type is P-type conductivity and said second conductivity type is N-type conductivity.

15. The device of claim 13, wherein said substrate comprises silicon and said doped semiconductor shared contact comprises silicon and germanium.

* * * * *